US006587323B1

(12) United States Patent
Falconer

(10) Patent No.: US 6,587,323 B1
(45) Date of Patent: Jul. 1, 2003

(54) DUAL PSEUDO REFERENCE VOLTAGE GENERATION FOR RECEIVERS

(75) Inventor: Maynard C. Falconer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,925

(22) Filed: Dec. 22, 1999

(51) Int. Cl.⁷ .................................................. H02H 3/00
(52) U.S. Cl. .............................. 361/90; 361/18; 361/58
(58) Field of Search .............................. 361/90, 18, 58; 326/127; 327/544; 365/189.09

(56) References Cited

U.S. PATENT DOCUMENTS

| 4,754,167 A | * | 6/1988 | Conkle et al. ............... 327/544 |
| 4,987,322 A | | 1/1991 | Wheeler ...................... 307/270 |
| 5,019,725 A | | 5/1991 | Yoshino ....................... 307/443 |
| 5,089,725 A | * | 2/1992 | Mollier et al. ............... 326/127 |
| 5,675,542 A | | 10/1997 | Ford ........................... 365/189 |
| 5,712,581 A | | 1/1998 | Kaylor ......................... 327/74 |
| 6,016,277 A | * | 1/2000 | Ansel et al. ............ 365/189.09 |

FOREIGN PATENT DOCUMENTS

| DE | 197 10 576 | 9/1998 |
| EP | 0 316 082 | 5/1989 |

* cited by examiner

Primary Examiner—Stephen W. Jackson
(74) Attorney, Agent, or Firm—Kenyon & Kenyon

(57) ABSTRACT

A circuit including a power supply plane, a ground supply plane, and a signal source that generates reference voltage signals and a first signal. The signal source includes a driver adapted to generate a first signal to the receiver, the first signal having a present and a previous voltage levels. The signal source also includes a low reference voltage generator and a high reference voltage generator, each producing a low reference voltage signal and a high reference voltage signal, respectively, from a low reference output and a high reference output, respectively. The high reference output and the low reference output are coupled to the ground plane and the power supply plane, respectively. The high reference voltage generator and the low reference generator are capable of communicating the high reference voltage signal and the low reference voltage signal to the receiver.

18 Claims, 10 Drawing Sheets

DUAL PSEUDO REFERENCE VOLTAGE GENERATION FOR RECEIVERS

FIELD OF THE INVENTION

The present invention pertains to the field of receivers. More particularly, the present invention pertains to reference voltage generation for a receiver.

BACKGROUND OF THE INVENTION

Components coupled to data lines of a bus typically communicate using a digital signal that varies between a high logic level and a low logic level. The high and low logic levels are typically represented by a high voltage and a low voltage on a data line, respectively. To communicate between two chips, the driver in a first chip will drive a signal that varies between the high and low voltages onto a data line of a bus. A receiver in a second chip (receiver chip) receives the signal and recognizes the logic level by comparing the voltage level of the signal to a reference voltage. After the receiver recognizes the logic level, the logic level is stored in a latch and made available to other elements in the receiver chip. For proper operation, the signal should have reached a stable level relatively close to the high or low voltage before the receiver captures the logic level (logic state) and stores it.

Unfortunately, the signal at the receiver does not change cleanly from a low voltage to a high voltage (or a high voltage to a low voltage) because of noise and ringback making it necessary to wait for a period of time before the signal has reached a relatively stable level. Due to noise and ringback, there is a period of time during which it is relatively uncertain (period of uncertainty) whether the signal is above or below the reference voltage. This period of uncertainty affects the frequency with which the driver can switch between the low and high voltages. Increasing periods of uncertainty typically require lower frequencies for proper operation. Lower frequencies result in relatively poor data throughput which is undesirable in meeting the increasing demand for high data throughput in today's high performance systems.

There are two techniques for decreasing the period of uncertainty, thereby allowing higher frequency signals to be used on the bus and improving performance. The first technique involves the receiver chip generating two reference voltages instead of just one reference voltage. The receiver selects the appropriate reference voltage based on the previous state of the signal at the receiver. For example, if the previous state of the signal is a low logic level represented by a low voltage, the receiver selects the low voltage reference, maximizing the ringback margin for the arriving signal. The ringback margin is maximized because the arriving signal will likely stay above the low voltage reference even when significant ringback occurs. If the previous state of the signal is a high logic level represented by a high voltage, the receiver selects the high voltage reference, also maximizing the ringback margin for the arriving signal.

Unfortunately, generating the two reference voltages at the receiver chip does not provide information about the noise effects that are occurring at the driver power planes or on the data line. Consequently, these noise effects cannot be accounted for at the receiver, making it difficult to operate the driver at a relatively high frequency.

The second technique for decreasing the period of uncertainty involves coupling the noise from the power planes of the driver to a single reference voltage generated at the driver. Generating the reference voltage at the driver and coupling the noise of the power planes to the driver is beneficial because it allows the noise effects at the driver to be accounted for and relayed to the receiver, decreasing the period of uncertainty for some cases of noise in the power planes. There are four cases in which noise can occur in the power supply plane (Vcc plane) and the ground plane (Vss plane): in both the power supply plane and the ground plane, in neither plane, or in just one plane or the other but not both planes. Unfortunately by coupling the noise from both planes to a single reference voltage, the period of uncertainty for some cases is decreased while for other cases it may actually increase. Since the frequency of the driver depends upon the worst case period of uncertainty, the driver frequency will be relatively low, resulting in relatively poor performance.

Since generating the reference voltages at the receiver typically requires the driver to operate at a relatively low frequency because the noise effects at the driver are not accounted for, it would be advantageous to generate the reference voltages in a manner that allows accounting for the noise effects at the driver. Additionally, since generating a single reference voltage that includes the effect of noise in both the Vcc and Vss planes requires the driver to operate at a relatively low frequency, it would be advantageous to account for the effect of noise in both the Vcc and Vss planes in a manner that would allow the driver to operate at a relatively higher frequency.

SUMMARY OF THE INVENTION

According to one embodiment of the invention a circuit including a power supply plane, a ground plane, and a signal source that generates reference voltages for detection by a receiver is described. The signal source includes a driver adapted to generate a first signal to the receiver, the first signal having a present and a previous voltage levels. The signal source also includes a low reference voltage generator and a high reference voltage generator, each producing a low reference voltage signal and a high reference voltage signal, respectively, from a low reference output and a high reference output, respectively. The high reference output and the low reference output are coupled to the ground plane and the power supply plane, respectively. The high reference voltage generator and the low reference generator are capable of communicating the high reference voltage signal and the low reference voltage signal to the receiver.

BRIEF DESCRIPTION OF THE DRAWINGS

The present invention is illustrated by way of example, and not limitation, in the figures of the accompanying drawings in which.

DETAILED DESCRIPTION

A method and apparatus for detecting signal levels is described. In the following description, for purposes of explanation, numerous specific details are set forth in order to provide a thorough understanding of the present invention. It will be evident, however, to one skilled in the art that the present invention may be practiced in any integrated circuit or discrete element circuit comprising elements such as, for example, discrete transistors, resistors and capacitors without these specific details. In other instances well known operations, functions and devices are not shown in order to avoid obscuring the invention.

Figure 1:
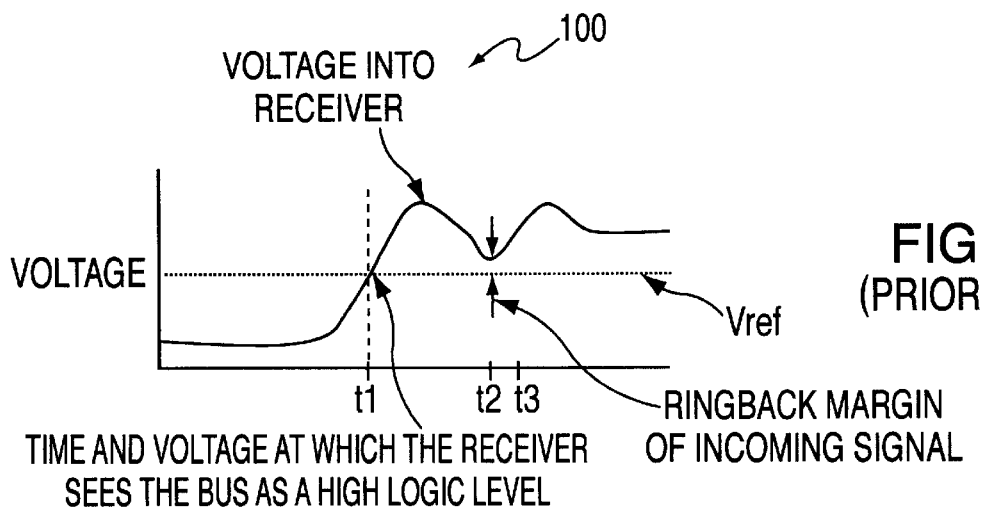
FIG. 1 illustrates a timing diagram for a rising edge signal and a single reference voltage.

Referring to FIG. 1, a timing diagram for a rising edge signal compared with a single reference voltage is illustrated. Timing diagram 100 is representative of the timing diagram for a receiver that receives a single voltage reference and an input signal indicative of either a low logic level or a high logic level. A receiver (not shown), such as an op-amp, can detect the logic level of the signal by comparing it to the reference voltage. As illustrated in FIG. 1, due to ringback there is relatively little margin between the voltage reference (Vref) and the signal. When there is noise in the voltage reference or the signal the margin can decrease or become zero, making it necessary to wait until after time t3 before there is confidence that the signal is a high logic level signal. Consequently, the time needed to recognize reliably the logic level of the signal at the receiver (time window) will have to be lengthened because of the uncertainty in the logic level of the signal in the time period between time t1 and time t3. If the period of uncertainty can be decreased, the time window can also be decreased, allowing faster switching times for the signal and a corresponding increase in the throughput on a bus. FIG. 1 illustrates a problem associated with using a single reference voltage generated at the receiver.

The period of uncertainty can be typically decreased by generating at the receiver two different reference voltages instead of one. Using two reference voltages will allow larger margins between a signal and a reference voltage. Timing diagrams for signals which are compared to one of two reference voltages are described below.

Figure 2A:
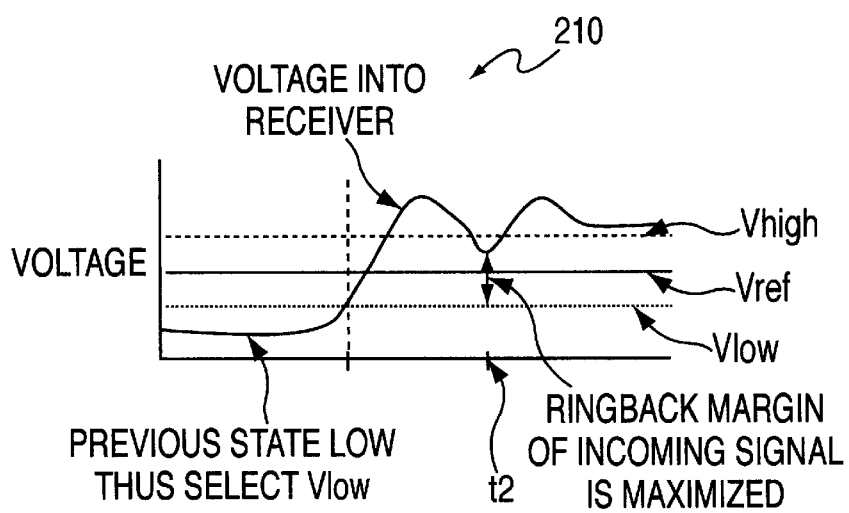
FIG. 2a illustrates a timing diagram for a rising edge signal compared to one of two reference voltages.
Figure 2B:
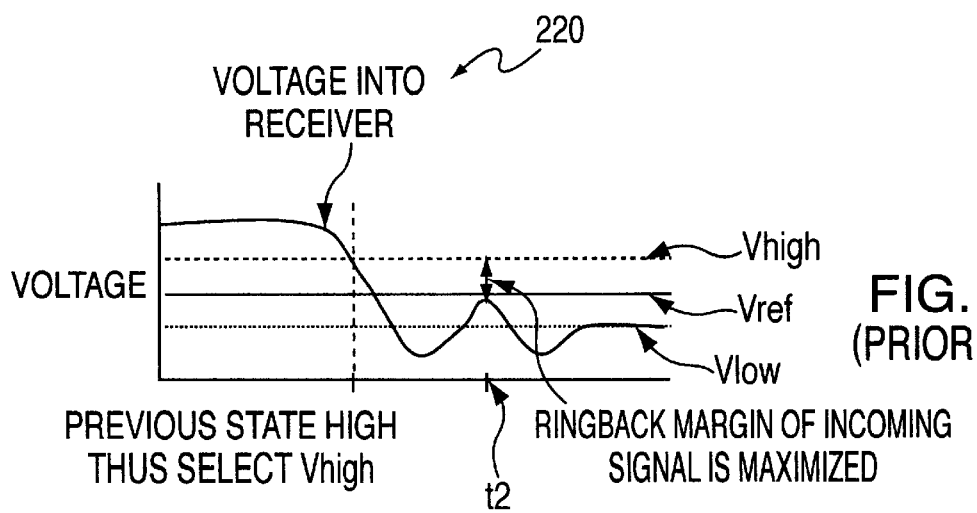
FIG. 2b illustrates a timing diagram for a falling edge signal compared to one of two reference voltages.

Referring to FIG. 2a, a timing diagram for a rising edge signal compared to one of two reference voltages, Vlow and Vhigh, is illustrated. A receiver (not shown), such as an op-amp, can detect the logic level of the signal by comparing it to either the Vlow or Vhigh reference voltage depending upon the logic level (or state) of the signal during the preceding clock cycle. Vlow and Vhigh are generated at the receiver and not the driver. As illustrated in FIG. 2a, the ring back margin at t2 is larger than the ringback margin at t2 in FIG. 1, which should be expected because Vlow is lower than Vref. FIG. 2b illustrates a timing diagram for a falling edge signal compared to one of two reference voltages, Vlow and Vhigh. Similarly, the ringback margin at time t2 is maximized because Vhigh is higher than Vref. By maximizing the ringback margin, the period of uncertainty is decreased, improving performance.

In the description of FIGS., 1, 2a and 2b, the effect of noise is not taken into account. Noise can be present in the power supply plane and the ground plane that provide power to the driver that generates the signal. Consequently, the signal may fluctuate as it travels from one logic level to another. Noise in the signal may increase or decrease the margin between the signal and the voltage reference, increasing the period of uncertainty and decreasing the performance. To counteract the change in margin due to noise at the driver power supply and ground planes, a reference voltage is generated at the driver rather than the receiver. Additionally, the reference voltage generator is coupled to the power supply plane and the ground plane such that the noise in the power supply plane and the ground plane changes the level of the reference voltage. The coupling between the reference voltage generator and the planes may be capacitive coupling. Timing diagrams for signals which move because of noise and which are compared to a single voltage reference that is influenced by noise in the power planes are described below. It should be appreciated that the term 'plane' does not necessarily imply a physical geometry.

Figure 3A:
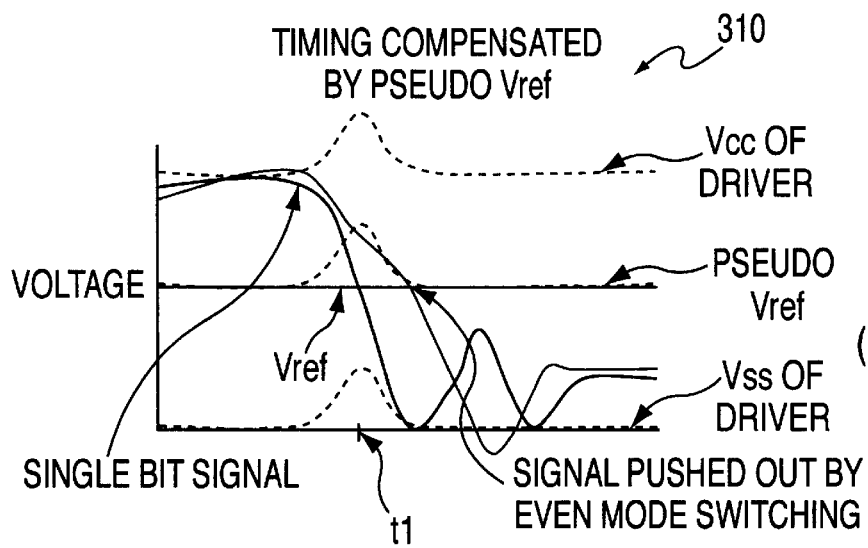
FIG. 3a illustrates a timing diagram for a falling edge signal that is compared to a pseudo-voltage reference that is influenced by noise in the power and ground planes.

FIG. 3a illustrates a timing diagram for a falling edge signal that is compared to a pseudo-voltage reference (pseudo Vref) that is influenced by noise. The falling edge signal is pushed out because of noise (pushed out signal) in the power supply plane (Vcc) and the ground plane (Vss) of the driver that generates the signal. The pseudo Vref has noise coupled to the pseudo Vref also causing the pseudo Vref to change as a function of the noise. Consequently, the pushed out signal intersects the pseudo Vref at t1 which is the same time at which the falling edge signal intersects Vref. Thus, there is no increase in the timing needed for the receiver to recognize the signal.

Figure 3B:
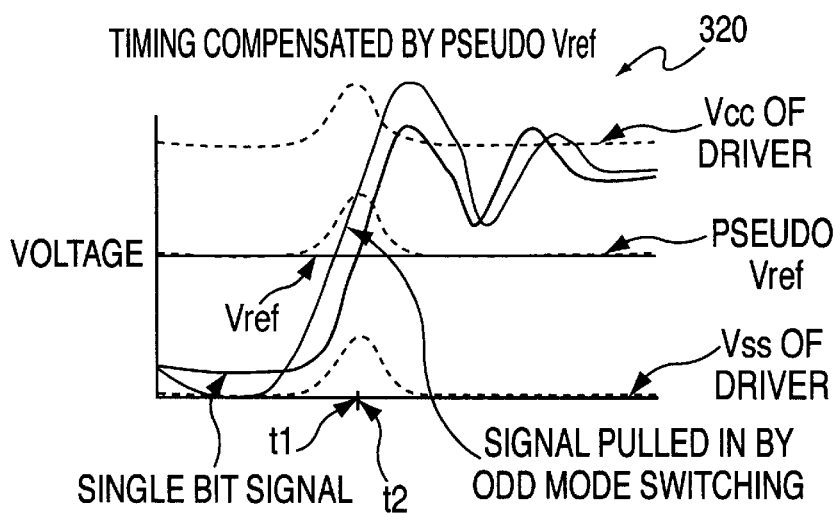
FIG. 3b illustrates a timing diagram for a rising edge signal that is compared to a pseudo-voltage reference that is influenced by noise in the power and ground planes.

FIG. 3b illustrates a timing diagram for a rising edge signal that is susceptible to noise and that is compared to a pseudo-voltage reference that is also influenced by the noise. The rising edge signal is pushed in because of noise (pushed in signal) in the power supply plane (Vcc) and the ground plane (Vss) of the driver that generates the signal. The pseudo Vref has noise coupled to the pseudo Vref also causing the pseudo Vref to change as a function of the noise. Consequently, the pushed in signal intersects the pseudo Vref at t1 which is earlier than time t2, the time at which the falling edge signal intersects Vref. Thus, there is a decrease in the timing needed for the receiver to recognize the signal.

Figure 3C:
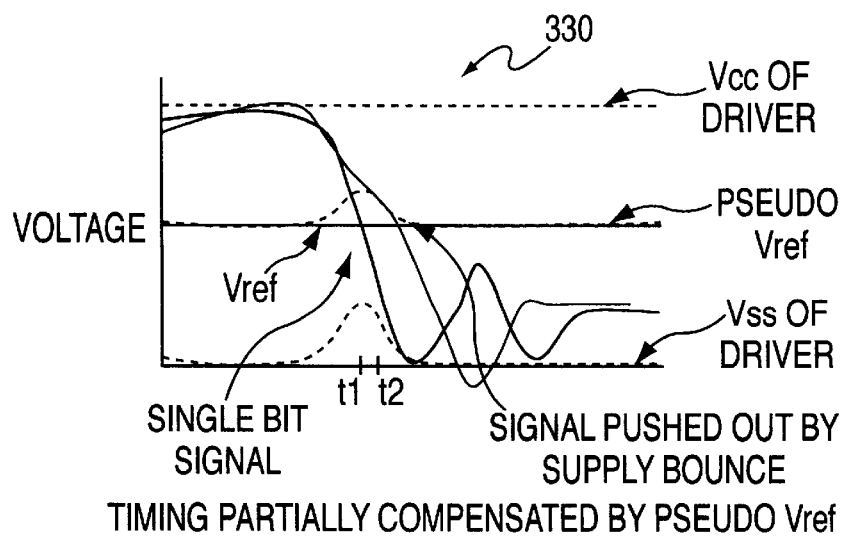
FIG. 3c illustrates a timing diagram for a falling edge signal that is compared to a pseudo-voltage reference that is influenced by noise in the ground plane.

FIG. 3c illustrates a timing diagram for a falling edge signal that is susceptible to noise and that is compared to a pseudo-voltage reference that is also influenced by the noise. The falling edge signal is pushed out because of noise (pushed out signal) in the ground plane of the driver that generates the signal. The pseudo Vref has noise coupled to the pseudo Vref also causing the pseudo Vref to change as a function of the noise. Consequently, the pushed out signal intersects the pseudo Vref at t2 which is later than time t2, the time at which the falling edge signal intersects Vref. Thus, there is an increase in the timing needed for the receiver to recognize the signal.

Figure 3D:
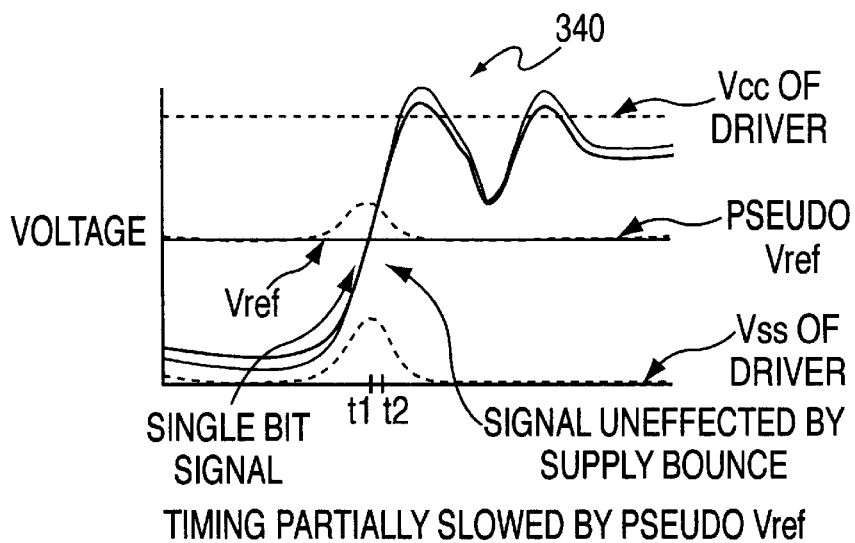
FIG. 3d illustrates a timing diagram for a rising edge signal that is compared to a pseudo-voltage reference that is influenced by noise in the ground plane.

FIG. 3d illustrates a timing diagram for a rising edge signal that is susceptible to noise and that is compared to a pseudo-voltage reference that is also influenced by the noise. The rising edge signal is unaffected by the noise in the ground plane of the driver that generates the signal. However, the pseudo Vref has ground plane noise coupled to the pseudo Vref causing the pseudo Vref to change as a function of the noise. Consequently, the signal intersects the pseudo Vref at t2 which is later than time t1, the time at which the rising edge signal intersects Vref. Thus, there is an increase in the timing needed for the receiver to recognize the signal.

Figure 3E:
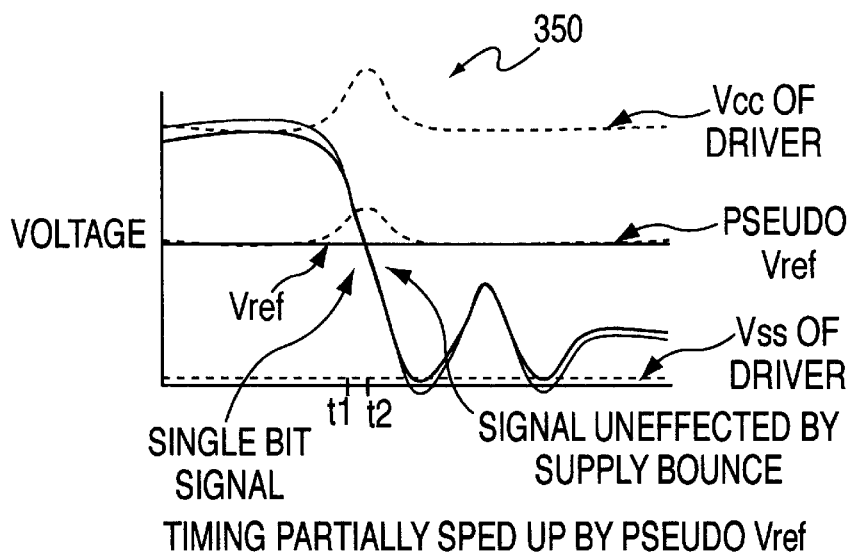
FIG. 3e illustrates a timing diagram for a falling edge signal that is compared to a pseudo-voltage reference that is influenced by noise in the power plane.

FIG. 3e illustrates a timing diagram for a falling edge signal that is susceptible to noise and that is compared to a pseudo-voltage reference that is also influenced by the noise. The falling edge signal is unaffected by the noise (pushed out signal) in the power supply plane of the driver that generates the signal. However, the pseudo Vref has power supply plane noise coupled to the pseudo Vref causing the pseudo Vref to change as a function of the noise. Consequently, the signal intersects the pseudo Vref at t1 which is earlier than time t2, the time at which the falling edge signal would have intersected Vref. Thus, there is a decrease in the timing needed for the receiver to recognize the signal.

Figure 3F:
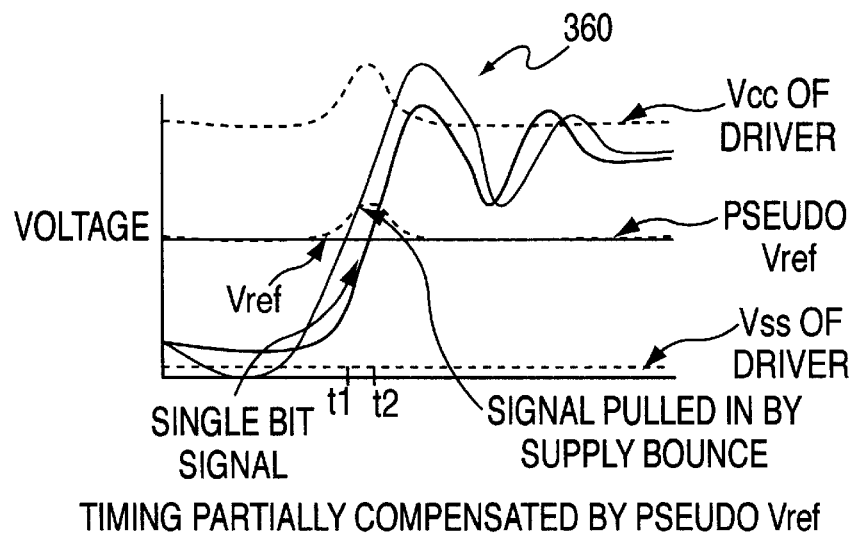
FIG. 3f illustrates a timing diagram for a rising edge signal that is compared to a pseudo-voltage reference that is influenced by noise in the power plane.

FIG. 3f illustrates a timing diagram for a rising edge signal that is susceptible to noise and that is compared to a pseudo-voltage reference that is also influenced by the noise. The rising edge signal is unaffected because of noise in the power supply plane of the driver that generates the signal. However, the pseudo Vref has power supply plane noise coupled to the pseudo Vref causing the pseudo Vref to change as a function of the noise. Consequently, the signal intersects the pseudo Vref at t1 which is earlier than time t1, the time at which the rising edge signal intersects Vref. Thus, there is a decrease in the timing needed for the receiver to recognize the signal.

Figure 3G:
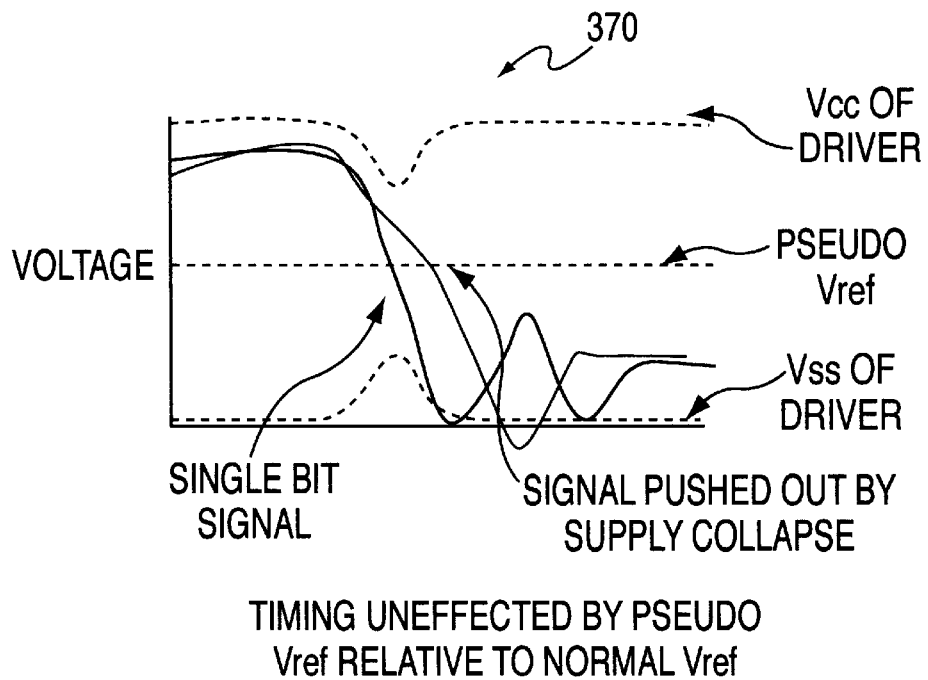
FIG. 3g illustrates a timing diagram for a falling edge signal that is compared to a pseudo-voltage reference that is influenced by power supply collapse.

FIG. 3g illustrates a timing diagram for a falling edge signal that is susceptible to power supply collapse and that is compared to a pseudo-voltage reference that is not influenced by the power supply collapse. "Power supply collapse" describes the condition where large current demands on Vcc and Vss occur simultaneously. Power supply collapse is the most common noise event in digital devices such as microprocessors. Power supply collapse also happens in analog circuits. The falling edge signal is pushed out because of the power supply collapse. However, the pseudo Vref is not affected. Consequently, the pushed out signal intersects the pseudo Vref at t2 which is later than time t1, the time at which the falling edge signal would have intersected Vref. Thus there is an increase in the timing needed for the receiver to recognize the signal.

As described above, having a single pseudo Vref which is coupled to both planes does not improve timing in all the cases illustrated above. The present invention provides two reference voltages each of which is separately coupled to a plane, resulting in improved timing for all the cases illustrated above.

Figure 4A:
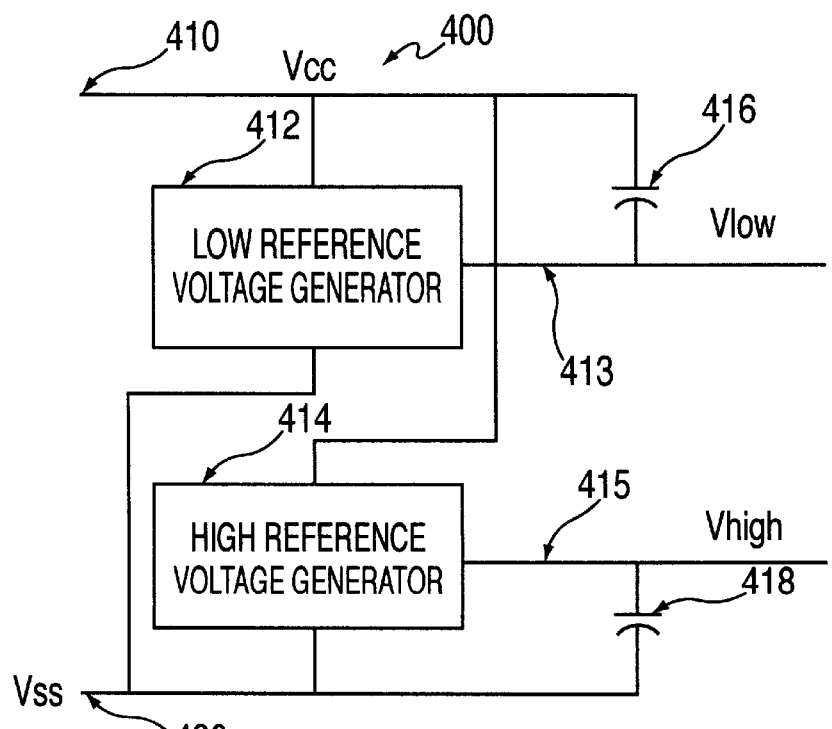
FIG. 4a illustrates a block diagram of a dual reference voltage generator for one embodiment of the present invention.

FIG. 4a illustrates reference voltage generators in accordance with an embodiment of the present invention. Reference voltage generator 400 includes a low reference voltage generator 412, a high reference voltage generator 414, power supply plane (Vcc) 410, ground supply plane (Vss) 420, and coupling capacitors 416 and 418. Voltage generator 412 is coupled to power supply plane 410 and ground supply plane 420 and produces a low voltage signal (Vlow) at low reference output 413. The power supply plane is typically noisy. The noise in the power supply plane is coupled to output 413 using coupling capacitor 116 allowing Vlow to change (increase or decrease) depending upon the noise. Since a signal generated by the driver also changes because of noise in Vcc 410, coupling noise in Vcc 410 to Vlow allows Vlow and the signal generated by the driver to maintain a predetermined margin.

Voltage generator 414 is coupled to power supply plane 410 and ground supply plane 420 and produces a high voltage signal (Vhigh) at high reference output 415. The ground supply plane is typically noisy. The noise in the ground supply plane is coupled to high reference output 415 using coupling capacitor 118 allowing Vhigh to change (increase or decrease) depending upon the noise. Since a signal generated by the driver also changes because of noise in Vss 420, coupling noise in Vss 420 to Vhigh allows Vhigh and the signal generated by the driver to maintain a predetermined margin.

Figure 4C:
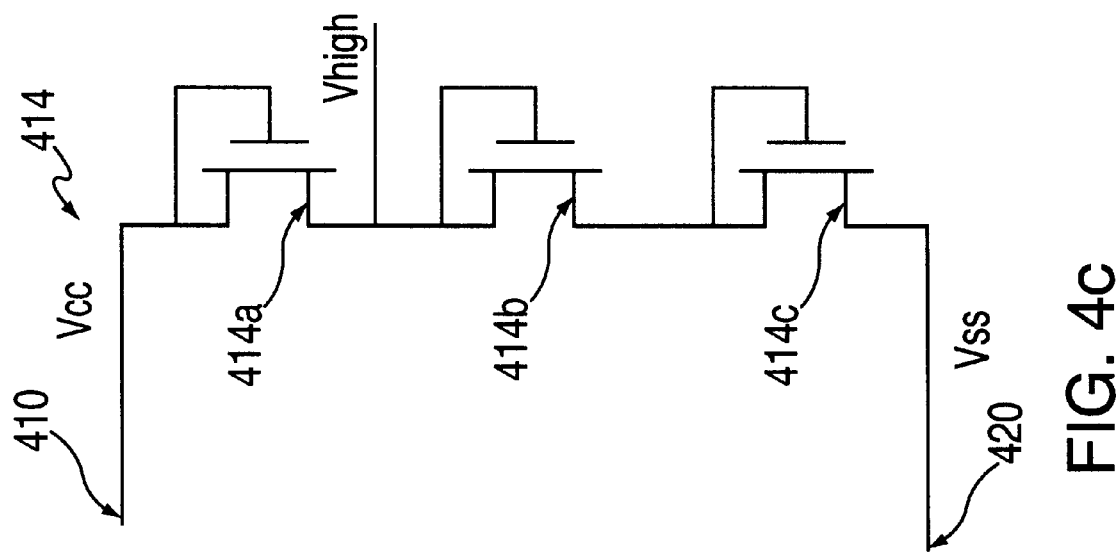
FIG. 4c illustrates an electrical diagram of a high reference voltage generator for another embodiment of the present invention.
Figure 4B:
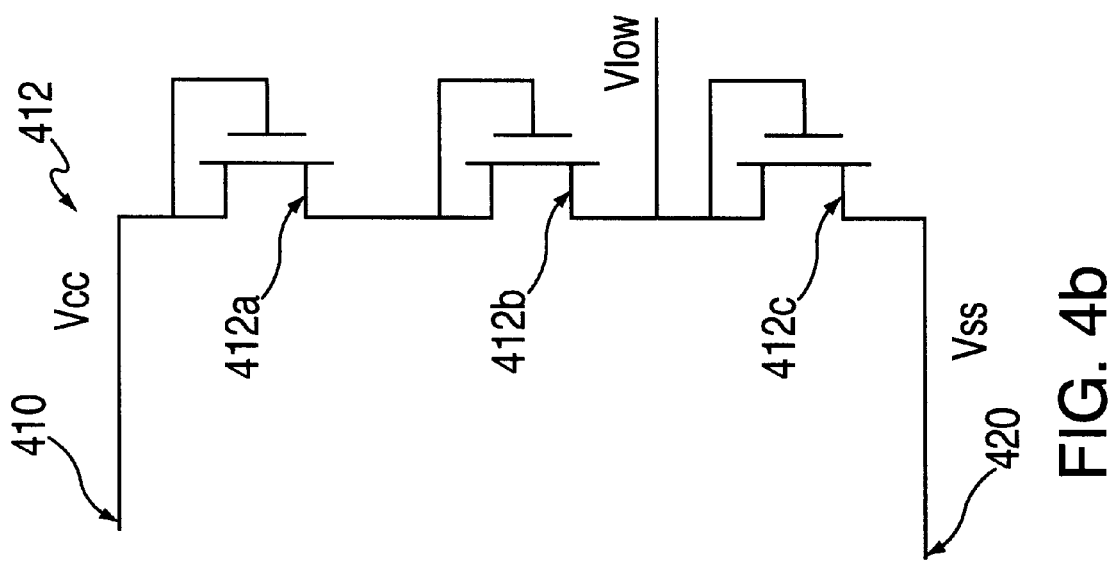
FIG. 4b illustrates an electrical diagram of a low reference voltage generator for one embodiment the present invention.

FIG. 4b illustrates a voltage generator for one embodiment of the present invention. Voltage generator 412 includes transistors 412a, 412b and 412c. Each of the transistors 412a, 412b, and 412c has a voltage drop across the transistor. The voltage drops are a function of physical parameters, such as width and length of the gate, and the voltage at the gate of the transistor. The gate of transistor 412a is coupled to Vcc 410, while the gate of transistor 412b is coupled to the drain of transistor 412a and the gate of transistor 412c is coupled to the drain of transistor 412b. Vlow produced by generator 412 is the voltage drop across transistor 412c.

FIG. 4c illustrates a voltage generator for another embodiment of the present invention. Voltage generator 414 includes transistors 414a, 414b and 414c. Each of the transistors 414a, 414b, and 414c has a voltage drop across the transistor. The voltage drops are a function of physical parameters, such as width and length of the gate, and the voltage at the gate of the transistor. The gate of transistor 414a is coupled to Vcc 410, while the gate of transistor 414b is coupled to the drain of transistor 414a and the gate of transistor 414c is coupled to the drain of transistor 414b. Vhigh produced by generator 414 is the voltage drop across transistor 414a.

While voltage generator 412 and 414 have been described as having three transistors, in an alternative embodiment each of the generators can have more or fewer transistors. While the gate of each of the transistors has been coupled to either the drain of an immediately preceding transistor or the power supply plane, in an alternative embodiment the gate of each of the transistors may be coupled to the power supply plane or another voltage source. Additionally, while the transistors can be n-type metal oxide transistors, in an alternative embodiment the transistors can be p-type metal oxide transistors. Moreover, voltage generator 412 and 414 can generate the reference voltages using voltages other than those supplied by Vcc and Vss.

Figure 5:
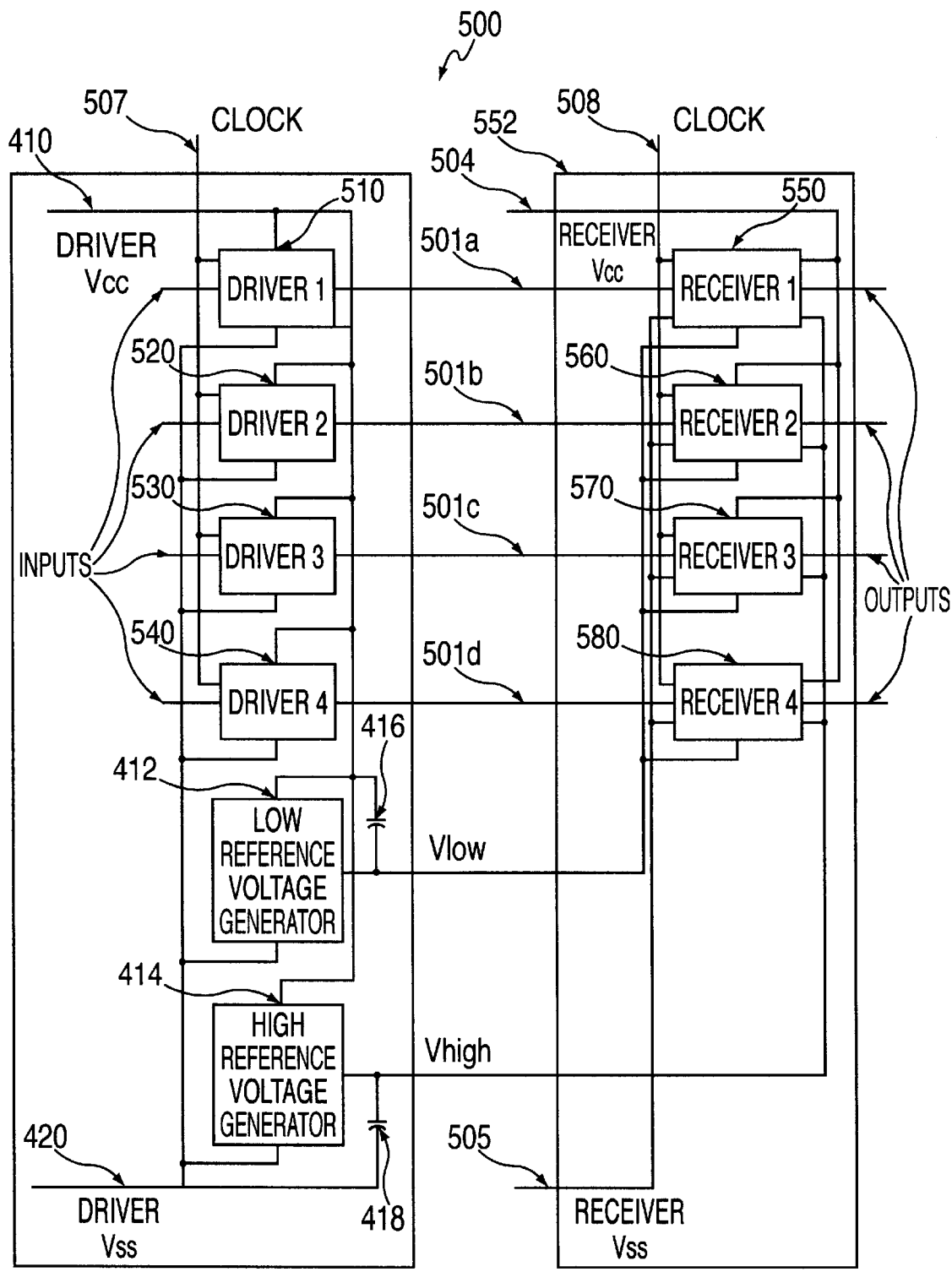
FIG. 5 illustrates a bus including a dual reference voltage generator in accordance with an embodiment of the present invention.

FIG. 5 illustrates a bus in accordance with an embodiment of the present invention. Bus 500 includes circuit 551 and circuit 552. Circuit 551 communicates data to circuit 552 using data lines 201a, 201b, 201c, and 201d. In an alternative embodiment, data lines 201a, 201b, 201c, and 201d are bidirectional allowing circuit 552 to communicate data to circuit 551. Circuits 551 and 552 can be a processor, an input/output (i/o) controller, a graphics chip, a memory circuit, a memory controller, a cache, or some other circuit or device that needs to communicate with another circuit or device using a data line. Circuit 551 includes driver 510, 520, 530, and 540, clock line 507, low reference voltage generator 412, high reference voltage generator 414, power supply plane 410, ground supply plane 420, and coupling capacitors 416 and 418. Drivers 510, 520, 530, and 540 communicate data received on their respective inputs to circuit 552 using lines 201a, 201b, 201c, and 201d (201a–d). Clock line 507 enables drivers 510, 520, 530, and 540 to output the signal received at their respective inputs. Drivers 510, 520, 530, and 540 receive power from power supply plane 410 and ground supply plane 420. Planes 410 and 420 typically include noise which may cause the signals driven by the drivers onto lines 201a–d to fluctuate. Generators 412 and 414 and coupling capacitors 416 and 418 operate in the same manner as described above in connection with FIG. 4a. The above description of generators 412 and 414 and coupling capacitors 416 and 418 is included here also.

Circuit 552 includes receiver 550, 560, 570, and 580. Receivers 550, 560, 570, and 580 receive the signals from drivers 210, 220, 230, and 240 on lines 201a–d. Receivers 550, 560, 570, and 580 receive power from power supply plane 504 and ground supply plane 505. Each of receivers 550, 560, 570, and 580 also receives Vlow and Vhigh generated by generators 412 and 414. If the signals received on lines 201a–d fluctuate due to noise in Vcc 410 and Vss 420, Vlow and Vhigh will also fluctuate because of the capacitive coupling to Vcc 410 and Vss 420. By controlling the amount of coupling, control can be achieved over the margin between reference voltages Vlow (or Vhigh) and a signal. Clock line 508 enables receivers 550, 560, 570, and 580 to detect the logic levels of the signals received from drivers 210, 220, 230, and 240 on lines 201a–d, respectively, and to output signals indicative of the logic levels of the signals received from the drivers. The signals indicative of the logic levels of the signals received from the drivers are used by other elements (not shown) in circuit 552. Each of the receivers selects between Vlow and Vhigh depending upon the logic level of the signal into the receiver during the preceding clock cycle. When the logic level during the preceding clock cycle is a logic high, the receiver selects Vlow to compare to the signal during the present clock cycle. When the logic level during preceding clock cycle is a logic low, the receiver selects Vhigh to compare to the signal during the present clock cycle.

Figure 6:
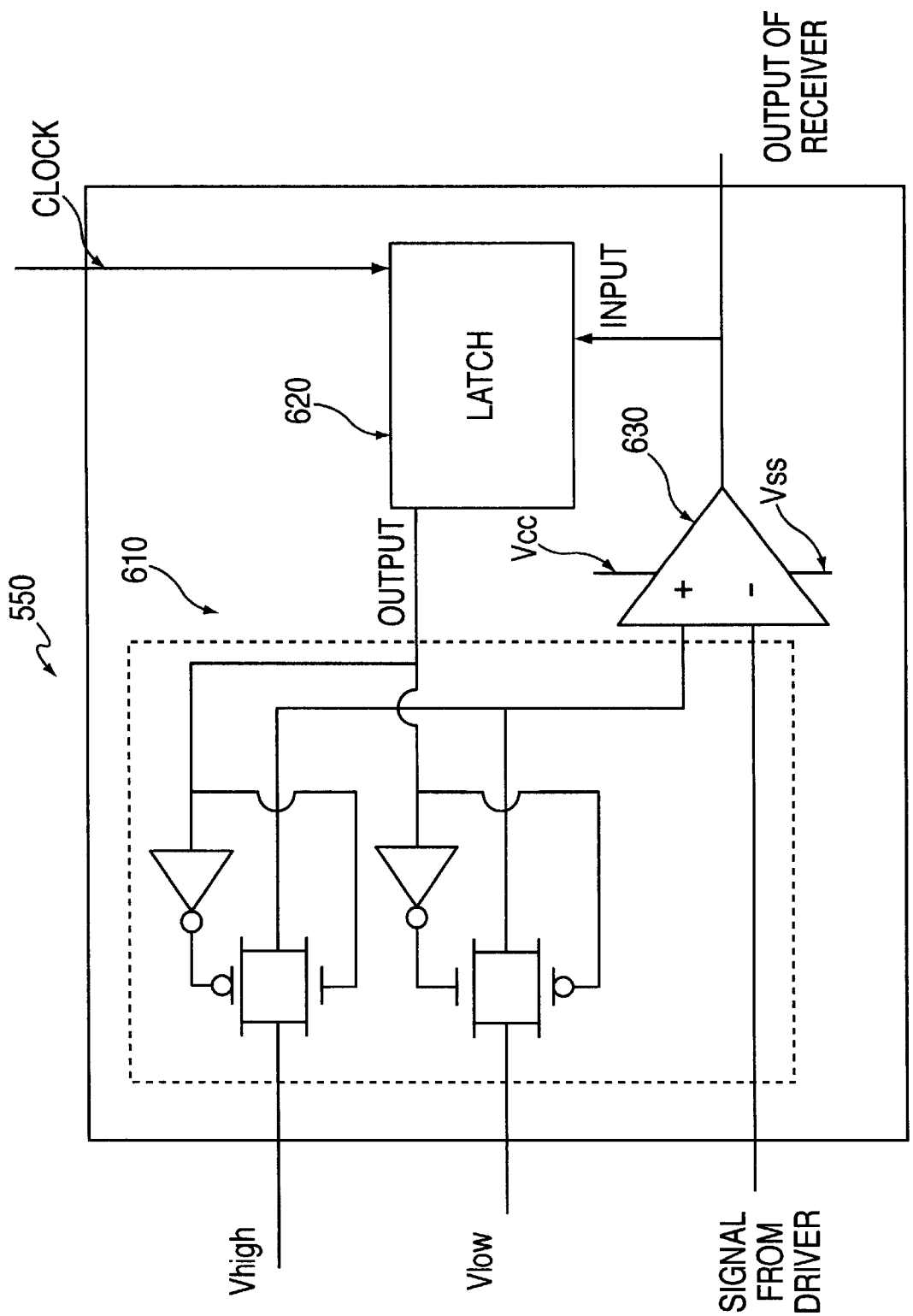
FIG. 6 illustrates a receiver in accordance with an embodiment of the present invention.

FIG. 6 illustrates in a receiver in accordance with an embodiment of the present invention. Receiver 550 of FIG. 5 is shown in greater detail in FIG. 6. Referring to FIG. 6, receiver 550 is representative of receivers 560, 570, and 580. Receiver 550 includes a switch 610, a latch 620, and a operational amplifier (op-amp) 630. Op-amp 630 generates a signal indicative of the logic state of the signal received on a line from the driver during a current clock cycle. Latch 620 stores the logic state of the signal received by op-amp 630 during a preceding (or previous) clock cycle and generates an output that is applied to switch 610. Switch 610 receives Vlow and Vhigh from generators 412 and 414 and selects either Vlow or Vhigh for application to op-amp 630 based upon the output of latch 620.

It should be appreciated by one of ordinary skill in the art that the present invention can be practiced in a variety of bus technologies including gunning transistor logic (GTL), complementary metal oxide semiconductor (CMOS), emitter coupled logic (ECL), open drain, and many others. Additionally, the reference generators of the present invention may be practiced with prior art receivers (i.e., "backwards compatible") even though the receivers may not necessarily benefit from the advantages afforded by this invention. For example, the prior art receiver that would receive a single Vref and a data signal as shown in FIG. 1 can be used with the Vref generators of the present invention by coupling both outputs of both generators to the Vref input of the receiver. Additionally, the prior art receiver that would select one of two voltage references (Vhigh or Vlow) as shown in FIG. 2a or FIG. 2b can be used with the Vref generators of the present invention by coupling the output of one generator to the Vhigh reference input of the receiver and the output of the other generator to the Vlow reference input of the receiver. Futhermore, the prior art receiver that would receive one pseudo Vref signal as shown in FIG. 3a or FIG. 3b can be used with the Vref generators of the present invention by coupling the outputs of both Vref generators to the single pseudo Vref signal input of the receiver.

FIGS. 7a–7f illustrate timing diagrams for signals and pseudo-voltage references generated for a bus in accordance with the present invention, such as bus 500. FIGS. 7a–7f show pseudo-voltage references which move independently due to noise in the power planes. The movement of the voltage references matches the movement in the signals since both are influenced by the same noise in the power planes. Consequently, the margins between the signal and the voltage reference can be maintained and the timing controlled, instead of changing as a function of the plane in which noise occurs as in FIGS. 3a–3g.

Figure 7A:
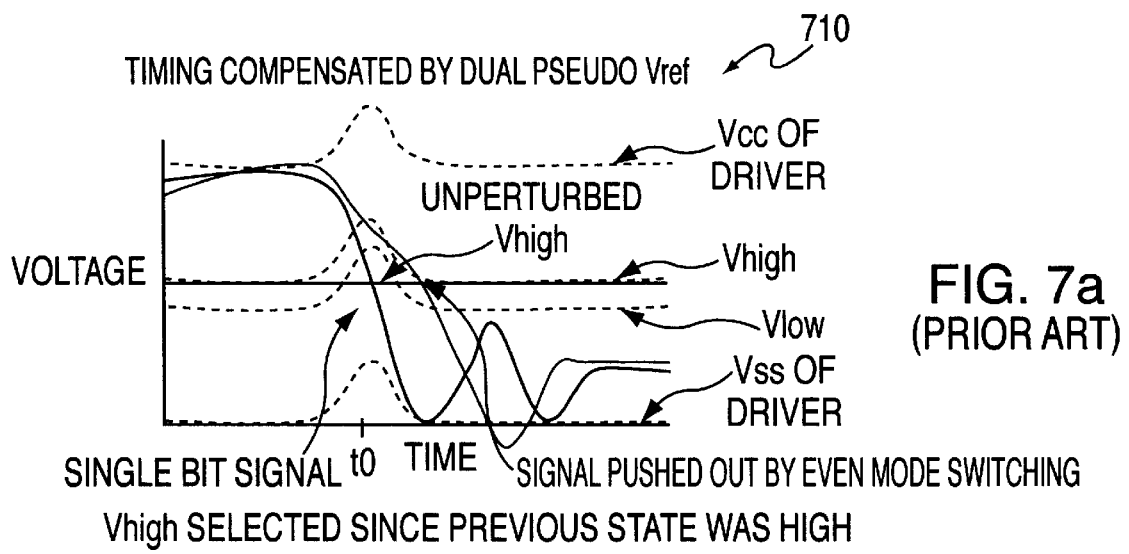
FIG. 7a illustrates a timing diagram for a falling edge signal that is compared to one of two pseudo-voltage references one of which is influenced by noise in the ground plane.

FIG. 7a illustrates a timing diagram for a falling edge signal that is compared to one of two pseudo-voltage references one of which is influenced by noise in the ground plane. As shown in FIG. 7a, the pushed out signal intersects the perturbed Vhigh at the same time that the single bit signal would have intersected the unperturbed Vhigh.

Figure 7B:
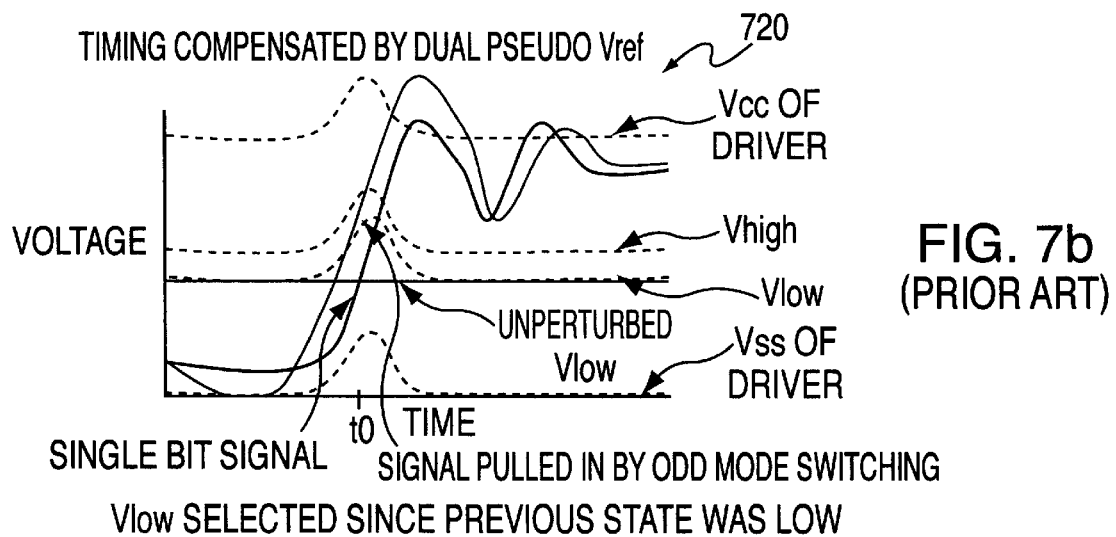
FIG. 7b illustrates a timing diagram for a rising edge signal that is compared to one of two pseudo-voltage references one of which is influenced by noise in the power plane.

FIG. 7b illustrates a timing diagram for a rising edge signal and dual pseudo reference voltages generated in accordance with the present invention under power and ground plane noise conditions. In FIG. 7b, the pulled in signal intersects perturbed Vlow at the same time that the single bit signal would have intersected the unperturbed Vlow.

Figure 7C:
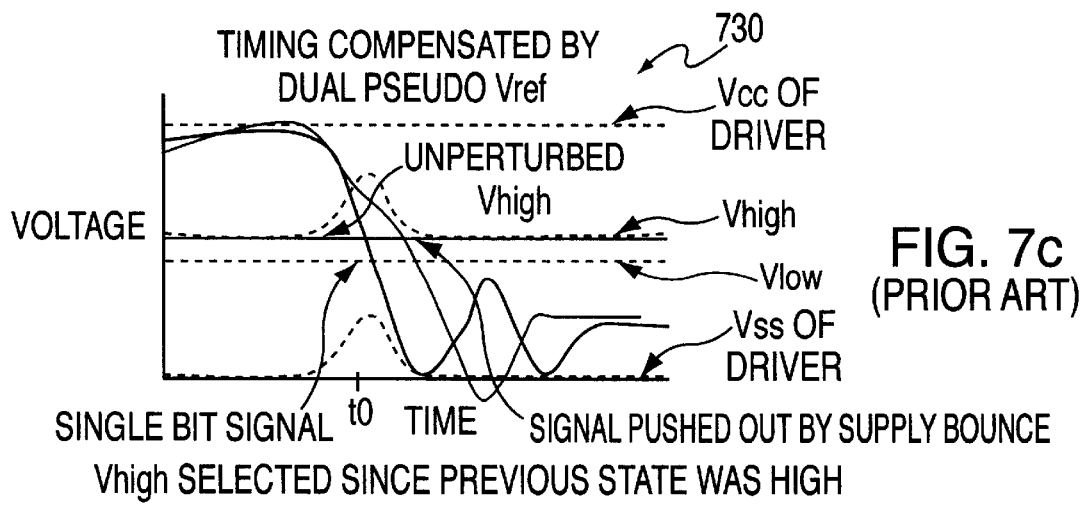
FIG. 7c illustrates a timing diagram for a falling edge signal that is compared to one of two pseudo-voltage references one of which is influenced by noise in the ground plane.

FIG. 7c illustrates a timing diagram for a falling edge signal and dual pseudo reference voltages generated in accordance with the present invention under ground plane noise conditions. In FIG. 7c, the pushed out signal intersects the perturbed Vhigh at the same time that the single bit signal would have intersected the unperturbed Vhigh.

Figure 7D:
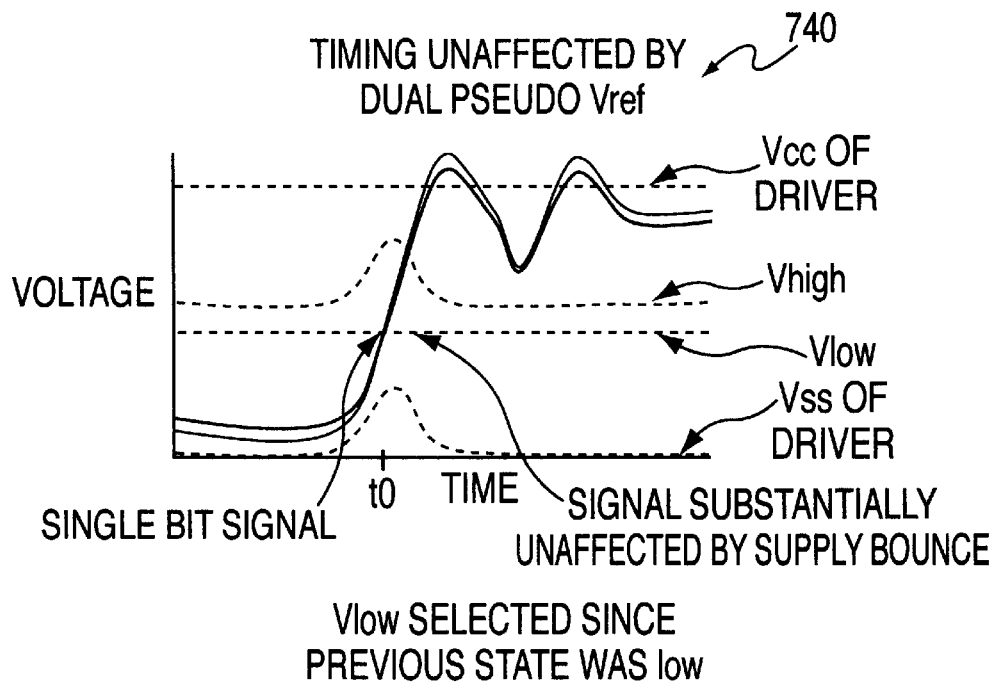
FIG. 7d illustrates a timing diagram for a rising edge signal that is compared to one of two pseudo-voltage references one of which is influenced by noise in the ground plane.

FIG. 7d illustrates a timing diagram for a rising edge signal and dual pseudo reference voltages generated in accordance with the present invention under ground plane noise conditions. In FIG. 7d, neither the signal nor Vlow are substantially affected by supply bounce in the ground plane. Consequently, the signal that is substantially unaffected by supply bounce intersects Vlow at substantially the same time that the single bit signal intersects Vlow.

Figure 7E:
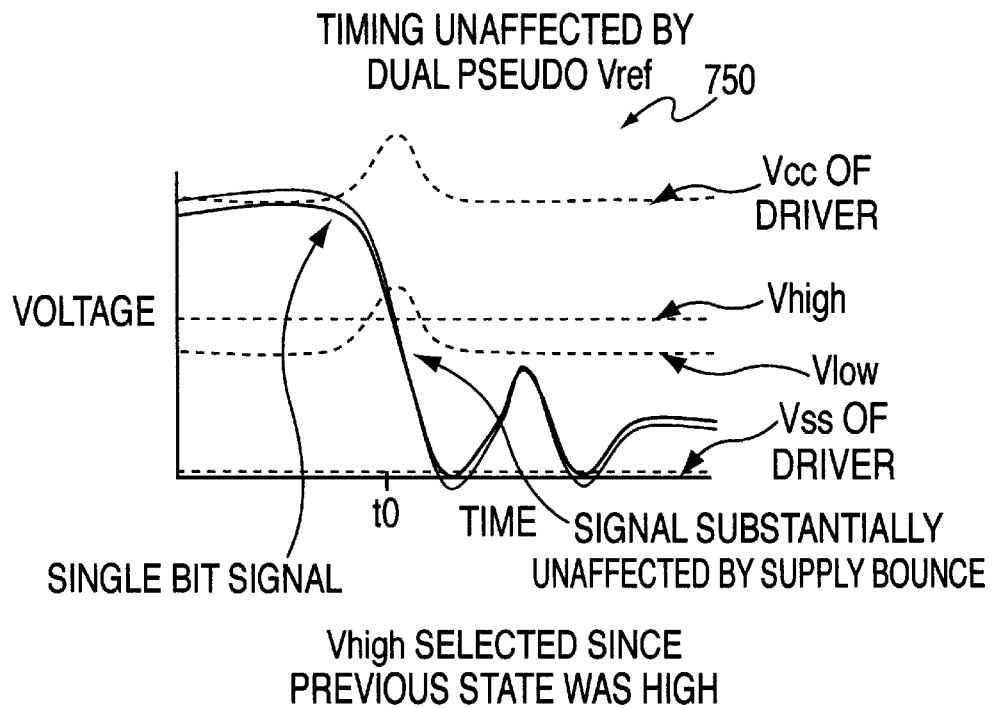
FIG. 7e illustrates a timing diagram for a falling edge signal that is compared to one of two pseudo-voltage references one of which is influenced by noise in the power plane.

FIG. 7e illustrates a timing diagram for a falling edge signal and dual pseudo reference voltages generated in accordance with the present invention under power plane noise conditions. In FIG. 7e, neither the signal nor Vhigh are substantially affected by supply bounce in the power supply plane. Consequently, the signal that is substantially unaffected by supply bounce intersects Vhigh at substantially the same time that the single bit signal intersects Vhigh.

Figure 7F:
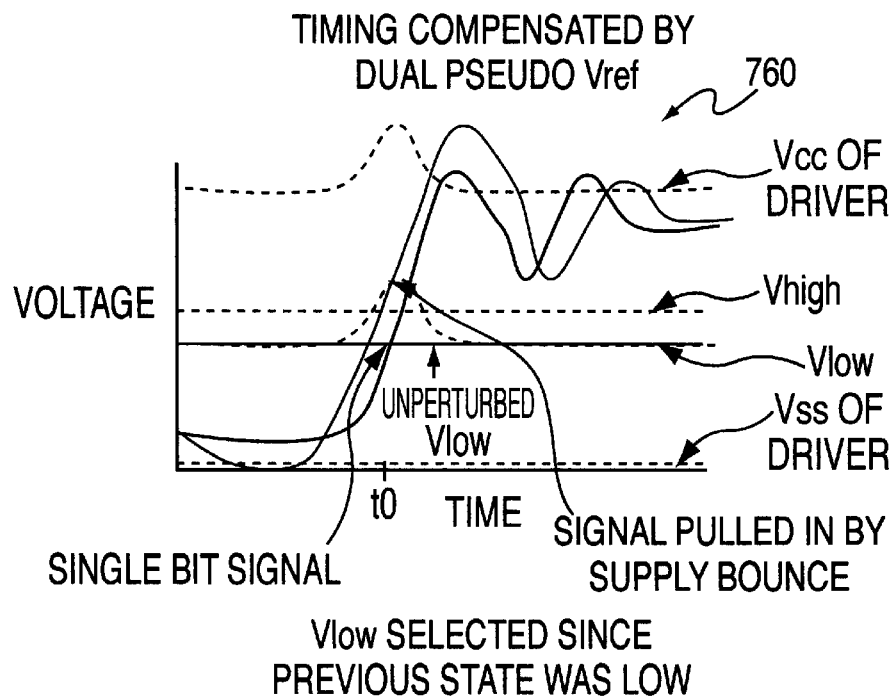
FIG. 7f illustrates a timing diagram for a rising edge signal that is compared to one of two pseudo-voltage references one of which is influenced by noise in the power plane.

FIG. 7f illustrates a timing diagram for a rising edge signal and dual pseudo reference voltages generated in accordance with the present invention under power plane noise conditions. In FIG. 7f, the signal that is pulled in by supply bounce in the power supply plane intersects the perturbed Vlow at substantially the same time as the single bit signal would have intersected the unperturbed Vlow.

Figure 7G:
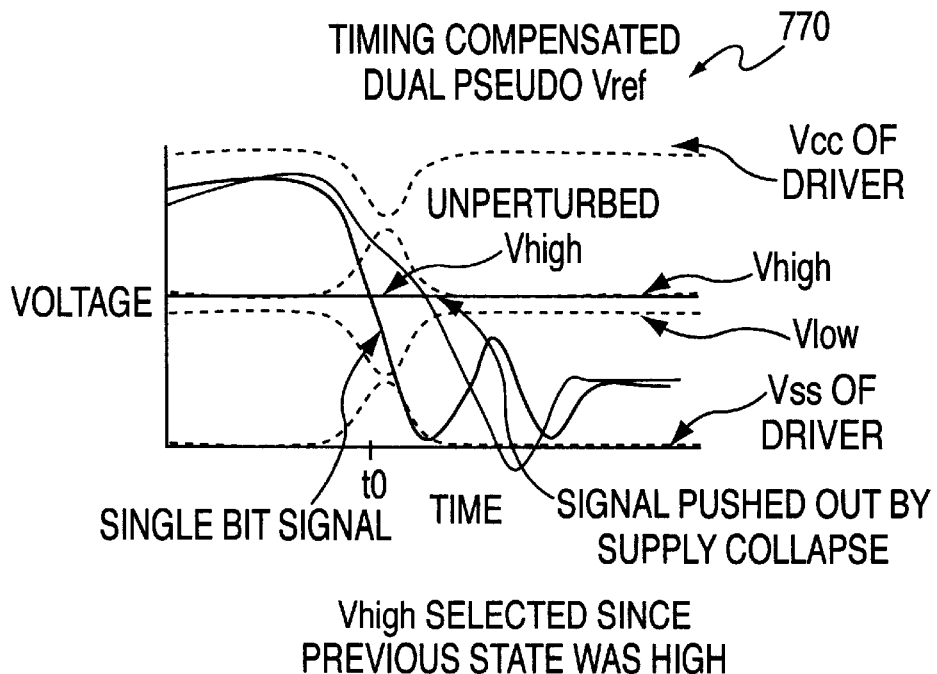
FIG. 7g illustrates a timing diagram for a falling edge signal that is compared to one of two pseudo-voltage references when there is power supply collapse

FIG. 7g illustrates a timing diagram for a falling edge signal and dual pseudo reference voltages generated in accordance with the present invention under power supply collapse conditions. In FIG. 7g, the signal that is pushed out by the supply collapse intersects the perturbed Vhigh at substantially the same time as the single bit signal would have intersected the unperturbed Vhigh.

Thus, a method and apparatus for generating reference voltages has been described. Although the present invention has been described with reference to specific exemplary embodiments, it should be appreciated by one of ordinary skill in the art that various modifications and changes may be made to these embodiments without departing from the broader spirit and scope the invention as set forth in the claims. Accordingly, the specification and drawings are to be regarded in an illustrative rather than a restrictive sense.

What is claimed is:

1. A circuit, comprising:
   a power supply plane;
   a ground plane;
   a signal source including,
      a driver that is to generate a first signal to a receiver, the first signal having a present voltage level and a previous voltage level, the driver coupled to the power supply plane and the ground plane,
      a low reference voltage generator having a low reference output from which a low reference voltage signal is to be produced, the low reference output is coupled to the power supply plane, and
      a high reference voltage generator having a high reference output from which a high reference voltage signal is to be produced, the high reference output is coupled to the ground supply plane, and the high reference voltage generator and the low reference voltage generator are capable of communicating the high reference voltage signal and the low reference voltage signal to the receiver.

2. The circuit of claim 1, further comprising:
   a receiver that is to receive the first signal, the high reference voltage signal and the low reference voltage signal.

3. The circuit of claim 2, wherein the receiver is to select one of the high reference voltage signal and the low reference voltage signal and to compare the present voltage level to the selected one of the high reference voltage signal and the low reference voltage signal.

4. The circuit of claim 3, wherein the receiver is to select the high reference voltage signal when the previous voltage level is a high voltage.

5. The circuit of claim 3, wherein the receiver is to select the low reference voltage signal when the previous voltage level is a low voltage.

6. The circuit of claim 4, wherein the receiver is to generate a low voltage signal when the present voltage level is lower than the high reference voltage signal.

7. The circuit of claim 5, wherein the receiver is to generate a high voltage signal when the present voltage level is higher than the low reference voltage signal.

8. In a circuit comprising a driver, power supply plane, a ground supply plane, a high reference voltage generator, and a low reference voltage generator, a method for generating reference voltages for detection by a receiver, the method comprising:
   generating a first signal by the driver, the first signal has a present voltage level and a previous voltage level;
   generating a high reference voltage signal from a high reference output of a high reference voltage generator, the high reference output coupled to the ground supply plane;
   generating a low reference voltage signal from a low reference output of a low reference voltage generator, the low reference output coupled to the power supply plane;
   selecting one of the high reference voltage signal and the low reference voltage signal based upon the previous voltage level; and
   comparing the present voltage level and the selected one of the high reference voltage signal and the low reference voltage signal.

9. The method of claim 8, wherein the comparing is performed by the receiver.

10. The method of claim 8, wherein the high reference voltage signal is selected when the previous voltage level is a high voltage.

11. The method of claim 8, wherein the low reference voltage signal is selected when the previous voltage level is a low voltage.

12. A bus, the bus comprising:
   a power supply plane;
   a ground plane;
   a signal source including,
      a driver adapted to generate a first signal to a receiver, the first signal having a present voltage level and a previous voltage level, the driver coupled to the power supply plane and the ground plane,
      a low reference voltage generator having a low reference output coupled to the power supply plane, the low reference voltage generator is to produce a low reference voltage signal at the low reference output, and a high reference voltage generator having a high reference output coupled to the ground supply plane, the high reference voltage generator is to produce a high reference voltage signal at the high reference output, the high reference voltage generator and the low reference voltage generator are capable of communicating the high reference voltage signal and the low reference voltage signal to the receiver.

13. The bus of claim 12, further comprising:

a receiver that is to receive the first signal, the high reference voltage signal and the low reference voltage signal.

14. The bus of claim 12, wherein the receiver is to select one of the high reference voltage signal and the low reference voltage signal and to compare the present voltage level to the selected one of the high reference voltage signal and the low reference voltage signal.

15. The bus of claim 12, wherein the receiver is to select the high reference voltage signal when the previous voltage level is a high voltage.

16. The bus of claim 12, wherein the receiver is to select the low reference voltage signal when the previous voltage level is a low voltage.

17. The bus of claim 12, wherein the receiver is to generate a low voltage signal when the present voltage level is lower than the high reference voltage signal.

18. The bus of claim 12, wherein the receiver is to generate a high voltage signal when the present voltage level is higher than the low reference voltage signal.

* * * * *